United States Patent
Bäumel et al.

[11] Patent Number: 5,966,291
[45] Date of Patent: Oct. 12, 1999

[54] POWER MODULE FOR THE CONTROL OF ELECTRIC MOTORS

[75] Inventors: Hermann Bäumel, Neumarkt; Kurt Geiger, Nürenberg; Hermann Kilian, Diespeck; Günter Leicht, Bamberg; Bernhard Schuch, Neusitz, all of Germany

[73] Assignee: Temic Telefunken microelectronic GmbH, Heilbronn, Germany

[21] Appl. No.: 08/963,199

[22] Filed: Nov. 3, 1997

[30] Foreign Application Priority Data

Nov. 6, 1996 [DE] Germany .................... 196 45 636

[51] Int. Cl.⁶ ............................................. H05K 7/20
[52] U.S. Cl. .................. 361/707; 165/80.3; 361/719; 257/723
[58] Field of Search ...................... 257/696, 706, 257/713, 723, 724, 796; 174/16.3; 165/80.3, 80.4, 185, 42; 363/141; 361/704, 707–712, 784, 785, 717–719

[56] References Cited

U.S. PATENT DOCUMENTS

| | | |
|---|---|---|
| 4,758,926 | 7/1988 | Herrell et al. . |
| 5,504,378 | 4/1996 | Lindberg et al. . |
| 5,539,254 | 7/1996 | Eytcheson .................. 257/691 |
| 5,631,821 | 5/1997 | Muso . |
| 5,708,297 | 1/1998 | Clayton .................... 257/723 |

FOREIGN PATENT DOCUMENTS

| | | |
|---|---|---|
| 1489684 | 10/1969 | Germany . |
| 2710432 | 9/1978 | Germany . |
| 3942392 | 6/1990 | Germany . |
| 4305793 | 9/1994 | Germany . |

*Primary Examiner*—Gerald Tolin
*Attorney, Agent, or Firm*—Venable; George H. Spencer

[57] ABSTRACT

A power module for the control of electric motors is described which displays an integrated design and provides the following functional units: A power unit with a circuit arrangement on the upper side of a substrate with power semiconductor components. A cooling unit with a cooling medium flowing through it, which has a heat sink with structured surface formed as an insert section onto which the underside of the substrate is directly fitted. A control unit with semiconductor components arranged on a carrier, which is arranged in parallel to and at a given distance from the substrate of the power unit. Contact pins between the substrate of the power unit and the carrier of the control unit for the connection and contacting of the circuit arrangement of the power unit with the semiconductor components on the control unit. A housing body, which encloses the power unit and the control unit. Two conductor bars which are led parallel to the substrate of the power unit and the carrier of the control unit and out through the housing body for the power supply to the circuit arrangement of the power unit. Connecting bars, which are led out of the housing body and connected to the circuit arrangement of the power unit and/or the semiconductor components of the control unit, for the application of control signals for the control of the power module and/or to tap off output signals from the power module.

8 Claims, 2 Drawing Sheets

5,966,291

POWER MODULE FOR THE CONTROL OF ELECTRIC MOTORS

BACKGROUND OF THE INVENTION

Power modules for the control of electric motors are used in many ways, for example to control the speed and performance of the electric motors. They normally consist of a power unit which has a circuit arrangement with semiconductor components, in particular integrated circuits (ICs) as circuit breakers, their own housing and connections for the power supply, for outputs (output voltage) and inputs (controls). They also normally have a separate heat sink to which the power unit is fitted for heat dissipation purposes, of the circuit breakers especially, as well as a separate control unit for the control of the power unit. Evaluation of the output voltage from the power module is normally carried out by a separate processing unit.

In the manufacture of the power module the power unit is usually manufactured first as a standard sub-assembly wherein the semiconductor components for the circuit arrangement are fitted to a substrate. The substrate is then soldered onto a carrier plate and the housing and connections are then fitted. This power unit is then screwed to the separate heat sink by its carrier plate (usually via an interface such as a heat conducting paste) as a standard sub-assembly. The circuit arrangement for the control unit, which is fitted to a suitable substrate (e.g. a PCB) separately from the power unit, is connected to the power unit (normally with a screwed connection). Because of the need for rugged feed lines (due to the design) between power unit and voltage supply as well as between the power unit and the control unit an additional compensation unit is needed for EMC purposes with a great number of semiconductor elements (coils and capacitors). The heat sink itself often also has to be connected to another cooling unit (liquid cooler) to dissipate the heat.

This sort of power module construction brings with it the following disadvantages:

The thermal resistance is conditional upon the internal construction of the power unit (substrate, carrier plate), the interface between the power unit and the heat sink and the separately-mounted cooling unit, such that poor heat transfer takes place, particularly between the semiconductor components (circuit breakers) of the power unit and the heat sink.

Due to the separate construction method of the individually-manufactured components and functional units of the power module and the necessary line connections between the functional units a greater surface area/volume and weight is required, which involves higher costs.

An increased amount of circuitry (multiplicity of semiconductor components, surface area requirement, costs) is necessary for the compensation unit.

The connection between the heat sink and the additional cooling unit is costly and can often only be achieved with poor thermal contact.

OBJECT OF THE INVENTION

It is an object of the invention to provide a power module for the control of electric motors which avoids these disadvantages.

SUMMARY OF THE INVENTION

This object is achieved according to this invention by the features in the characterizing clause in the patent claim 1.

Further advantageous improvements arise from the sub-claims.

The individual functional units are arranged in a compact combined form in the power module which is introduced here and are preferably integrated into a common housing, wherein:

The semiconductor components for the circuit arrangement of the power unit are fitted to a suitable substrate and this substrate is directly fitted onto a heat sink with an optimized surface made of a material with good heat-conducting properties and is connected to this by soldering (for example with soft solder).

The heat sink is designed as an insert section and can be integrated directly into the (complete) cooling unit of the power module.

The control unit is fitted on a carrier in parallel in a separate plane at a given distance from the substrate which carries the circuit arrangement of the power unit, wherein the semiconductor components of the control unit can be arranged on one or both sides of the carrier and make contact with the circuit arrangement of the power unit through vertically-arranged contact pins (connecting bars or ties). As an option, if the semiconductor components of the control unit are only fitted to the top side of the carrier, a metallic plate can be fitted to the underside of the carrier, which faces the substrate, as an additional carrier for the purposes of EMC screening and increasing the mechanical strength (for example for use in motor vehicles).

In another plane in parallel to and at a given distance from the control unit carrier (above the carrier) or on the same level as the control unit further functional units can be provided to implement additional functions (for example current measurement and signal processing)

The power module inherently unites several advantages:

Compact design with low surface area/volume requirement and low cost.

An improvement in heat transfer between the semiconductor components of the power unit and the heat sink through direct cooling of the semiconductors and the integration of the heat sink into the cooling unit.

An increase in the reliability and service life of the semiconductor components of the power unit and thereby the power module.

Due to the symmetric and minimal lengths of the connecting lines only a minimum amount of circuitry is necessary for the compensation unit to correct leakage inductance.

DESCRIPTION OF A PREFERRED EMBODIMENT

Figure 1:
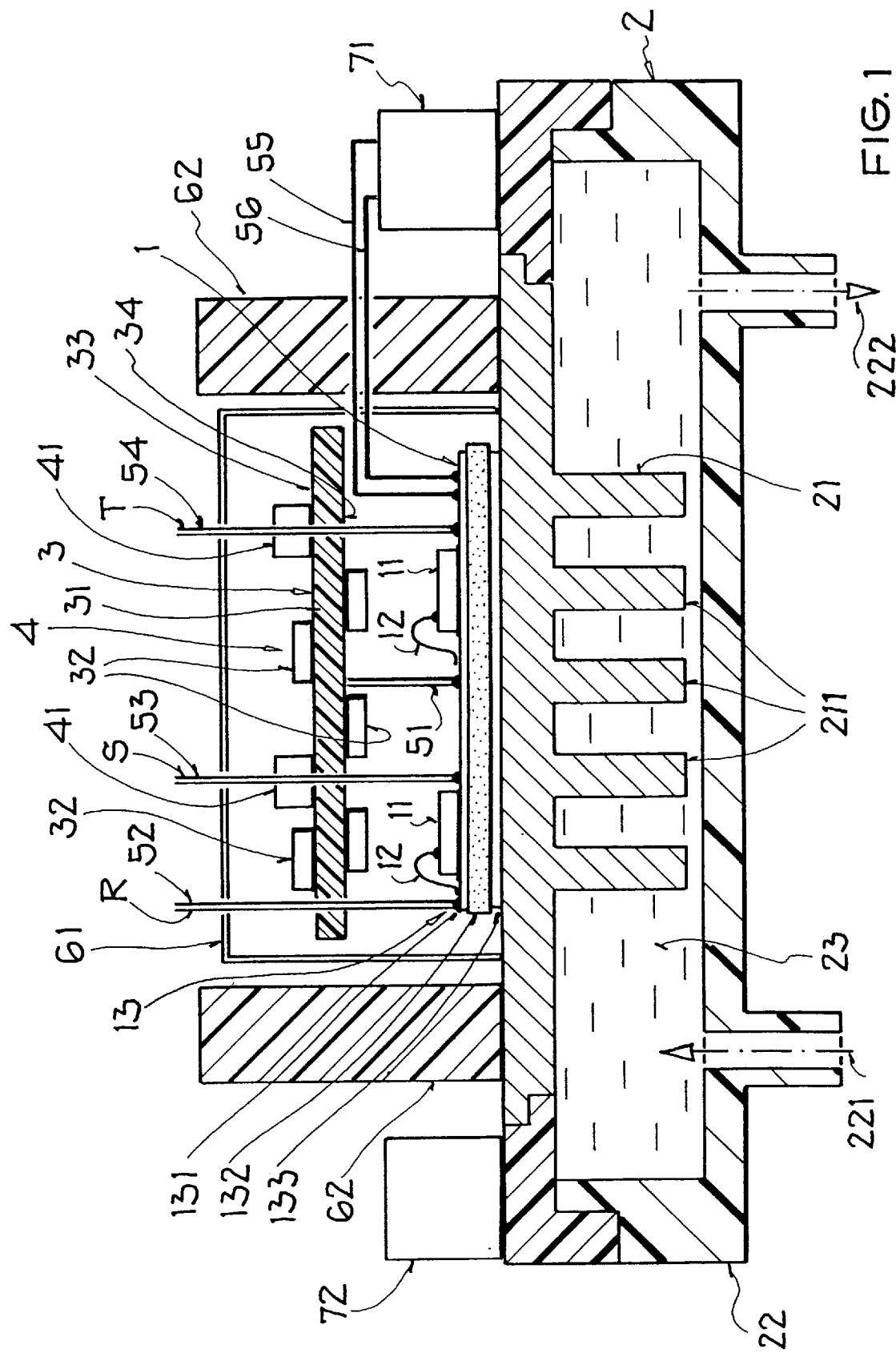
FIG. 1 shows a sectional view.

The power module introduced here is described in the following with the help of FIGS. 1 and 2 of the drawing taking as an example a converter for the control of three-phase electric motors.

Figure 2:
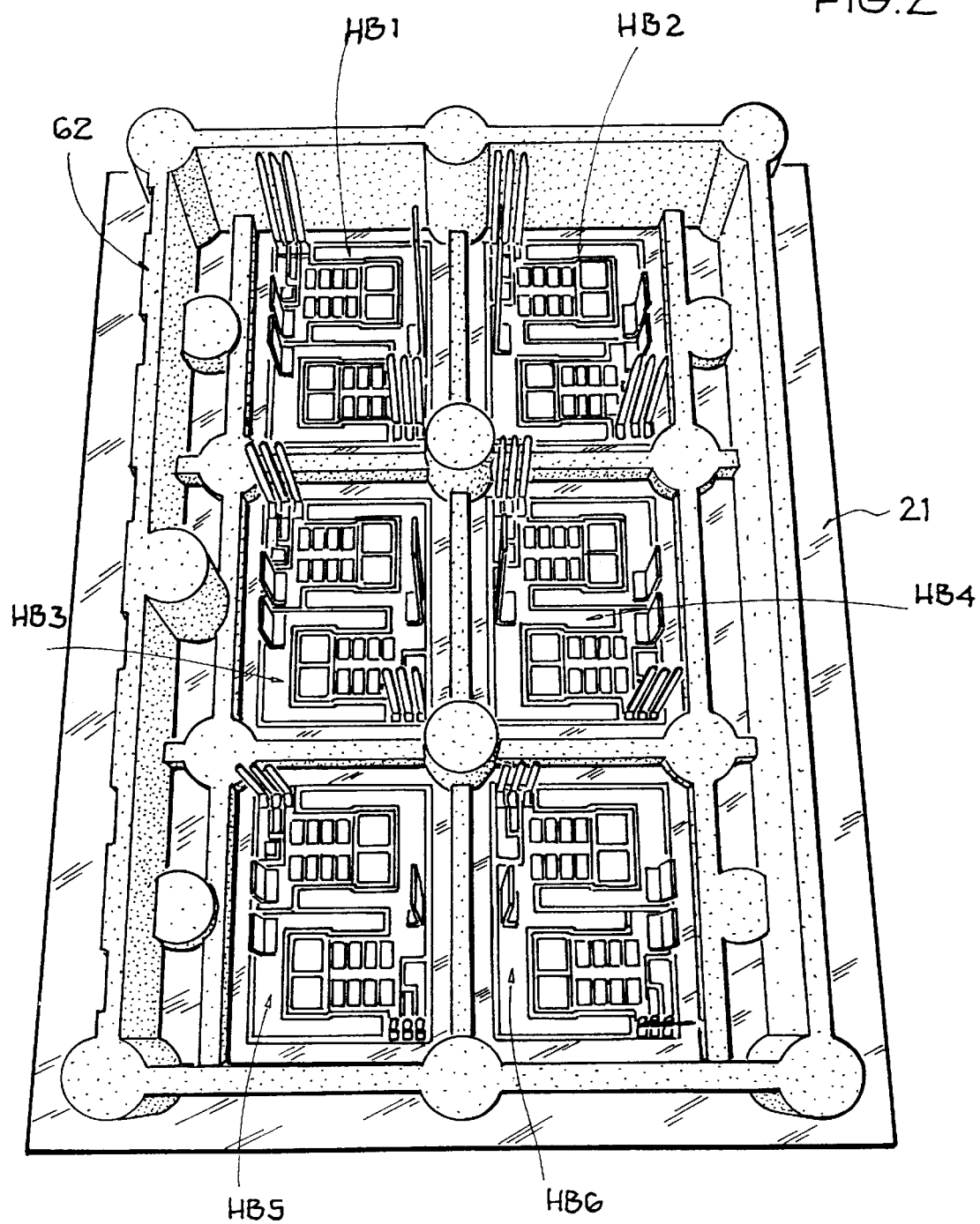
FIG. 2 shows a top view of the power module.

According to FIGS. 1 and 2 the semiconductor components of the circuit arrangement of power unit 1 are separately soldered as one half bridge (also called branch pair) HB each on a DCB (direct copper bonding) substrate 13 (ceramic carrier 132 between two copper layers 131, 133)

and make contact via bonding wires 12. For example, two IGBT transistors 11, as circuit breakers for the control of the electric motor, and four diodes, are provided for each half bridge HB, as semiconductor components. The converter function (as can be seen in FIG. 2) is achieved by the parallel switching of the half bridges HB1, HB2 or HB3, HB4 or HB5, HB6 (two half bridges for each phase). This provides a low induction and symmetrical construction for the branch pairs wherein the required current-carrying capacity of the power module is achieved by the parallel switching of two (or more if necessary) DCB substrates 13.

The DCB substrates 13 are attached directly to a heat sink 21 (for example made of copper), which is formed as an insert section and can be inserted into the cooling unit 2 and which then forms the top section of cooling unit 2. The surface area of the copper heat sink is increased with ribs 211. The lower section of cooling unit 2 is formed as a half shell 22 (made of aluminum for example) in which the cooling medium 23 (for example water) flows in through the inlet opening 221 and out through outlet opening 222. The assembly surface of the semiconductor components for the power unit 1 is therefore in direct contact with the cooling medium 23 in the cooling unit 2 so that the semiconductor components of power unit 1 are directly cooled via the copper assembly surface 133 of the DCB substrate 13. This ensures good heat transfer and good cooling of the semiconductor components, in particular the circuit breakers (IGBT transistors 11) of power unit 1.

At a minimum vertical spacing above DCB substrate 13 of power unit 1 is the control unit 3 on a carrier 31. The semiconductor components 32 on control unit 3 for the control of power unit 1 are for example arranged on both sides of a PCB as carrier 31. (In the case of a single-sided arrangement of the semiconductor components 32 on the top side 33 of the carrier 31 a metallic plate can be provided on the underside 34 of carrier 31, which provides good screening against power unit 1 as well as a good mechanical attachment).

Contacting of the control unit 3 is provided by contact pins 51 which act as connecting bars and which are soldered for example onto DCB substrate 13 of power unit 1. The direct connection between the power unit 1 and control unit 3 minimizes the leakage inductance and the number of semiconductor components in a compensation unit. The vertical arrangement of the contact pins 51 brings about parallel and symmetrical contacting with advantageous electrical properties.

The power supply to the semiconductor components 11 and 32 on the power unit 1 and the control unit 3 is provided by two conductor bars 55 and 56 (for example made of coppersheet) with insulating interface and exchangeable polarity (+/−) which are connected to an intermediate circuit capacitor 71 (compensation component). Contacting of the connections of the semiconductor components 11 and 32 with the conductor bars 55 and 56 is carried out for example by soldering.

On the carrier 31 of control unit 3 are supplementary semiconductor components to provide further functional units 4, for example for the implementation of current measurement via current transformer elements 41 including processing of the output signal of power unit 1. In addition a separate evaluation unit 72 can be provided for further processing of signals.

The (symmetrical) merging of the functional units arranged at the different levels—power unit 1, control unit 3 and additional functional units 4—is achieved with the vertical connecting bars 52, 53 and 54 which form the outputs R, S and T of the power module.

Power unit 1, control unit 3 and the other functional units 4 of the power module are integrated into a common housing 61, from which the connecting bars 52, 53 and 54 are led out as outputs R, S and T as well as conductor bars 55 and 56. In addition a housing frame 62 can be provided (for example a plastic housing frame) which would serve as a retainer for the conductor bars 55, 56 and as limitation for the passivation of the functional units, i.e. power unit 1, control unit 3 and the other functional units 4 (for example using silicon gel).

What is claimed is:

1. Power module for the control of electric motors, consisting of a power unit (1) with a circuit arrangement on the upper side (131) of a substrate (13) with power semiconductor components (11), a heat sink (2) with a cooling medium (23) flowing through it, which has a heat sink (21) with structured surface formed as an insert section onto which the underside (133) of the substrate (13) is directly fitted, a control unit (3) with semiconductor components (32) arranged on a carrier (31) which is arranged in parallel to and at a given distance from the substrate (13) of the power unit (1), contact pins (51) between the substrate (13) of the power unit (1) and the carrier (31) of the control unit (3) for the connection and contacting of the circuit arrangement of the power unit (1) with the semiconductor components (32) on the control unit (3), a housing body (61) which encloses the power unit (1) and the control unit (3), two conductor bars (55, 56) which are led parallel to the substrate (13) of the power unit (1) and the carrier (31) of the control unit (3) and out through the housing body (61) for the power supply to the circuit arrangement of the power unit (1), connecting bars (52, 53, 54), which are led vertically from the substrate (13) of the power unit (1) and the carrier (31) of the control unit (3) out of the housing body (61) and connected to the circuit arrangement of the power unit (1) and/or the semiconductor components (32) of the control unit (3), for the application of control signals for the control of the power module and/or to tap off output signals (R, S, T) from the power module.

2. Power module according to claim 1, wherein additional functional units (4) are arranged within the housing (61).

3. Power module according to claim 2, wherein as additional functional units (4) a current measuring unit and/or an evaluation unit are provided.

4. Power module according to claim 2, wherein the additional functional units (4) are arranged on at least one additional carrier, which is/are arranged in parallel to and at a given distance from the carrier (31) of the control unit (3).

5. Power module according to claim 2, wherein the further functional units (4) are arranged on the carrier (31) of the control unit (3).

6. Power module according to claim 1, wherein semiconductor components (32, 41) are arranged on both sides (33, 34) of the carrier (31).

7. Power module according to claim 1, wherein semiconductor components are only arranged on the side (33) of the carrier (31) which faces away from the substrate (13) of the power unit (1).

8. Power module according to claim 7, wherein a metallic plate is arranged on the side (34) of the carrier (31) which faces substrate (13) of the power unit (1).

* * * * *